(12) United States Patent
Funahashi et al.

(10) Patent No.: US 6,376,763 B2
(45) Date of Patent: Apr. 23, 2002

(54) COMPLEX OXIDE HAVING HIGH SEEBECK COEFFICIENT AND HIGH ELECTRIC CONDUCTIVITY

(75) Inventors: Ryoji Funahashi; Ichiro Matsubara; Satoshi Sodeoka, all of Ikeda (JP)

(73) Assignee: Agency of Industrial Science and Technology, Tokyo (JP)

( * ) Notice: Subject to any disclaimer, the term of this patent is extended or adjusted under 35 U.S.C. 154(b) by 0 days.

(21) Appl. No.: 09/733,799

(22) Filed: Dec. 8, 2000

(30) Foreign Application Priority Data

Feb. 10, 2000 (JP) .......................................... 2000-032595

(51) Int. Cl.$^7$ ................................................ H01L 35/34
(52) U.S. Cl. .................... 136/201; 136/205; 136/236.1; 423/635
(58) Field of Search ................................ 136/203, 205, 136/201, 236.1; 423/583, 593, 594, 635

(56) References Cited

U.S. PATENT DOCUMENTS 5,168,095 A    12/1992    Munakata et al. .............. 505/1

FOREIGN PATENT DOCUMENTS

| EP | 0 602 782 A | 6/1994 |
| JP | 03 069701 B | 7/2000 |

OTHER PUBLICATIONS

Abstract: S. Li, et al., "High Temperature Thermoelectric Properties of Oxide Ca9Co12O28", Proc. Int. Conf. Thermoelectr. (1999), 18th, 581–583 No month provided.

A. C. Masset, et al. "Misfit–layered cobaltite with an anisotropic giant magnetoresistance: $Ca_3Co_4O_9$". The American Physical Society, vol. 62, No. 1, 2000, pp. 166–175 Jul. 1, 2000.

Siwen Li, et al., "High temperature thermoelectric properties of oxide $Ca_9Co_{12}O_{28}$", J. Mater. Chem., 1999, 9 pp. 1695–1660 No month provided.

Eduard Woermann, et al., "Phase equilibria in the system CaO–Cobalt Oxide in air", J. inorg. nucl. Chem., 1970, vol. 32, pp. 1455–1459 No month provided.

Primary Examiner—Bruce F. Bell
Assistant Examiner—Thomas H Parsons
(74) Attorney, Agent, or Firm—Knobbe, Martens, Olson & Bear, LLP

(57) ABSTRACT

This invention provides a complex oxide comprising the features of: (i) being represented by the formula: $Ca_{3-x}RE_xCo_4O_y$ wherein RE is a rare earth element, $0 \leq x \leq 0.5$ and $8.5 \leq y \leq 10$, (ii) having a Seebeck coefficient of 100 $\mu$V/K or more at a temperature of 300° C. or higher, and (iii) having an electric conductivity of $10^3$ S/m or more at a temperature of 300° C. or higher. The complex oxide is composed of low-toxicity elements, excellent in heat resistance and chemical durability and high in thermoelectric conversion efficiency.

10 Claims, 3 Drawing Sheets

COMPLEX OXIDE HAVING HIGH SEEBECK COEFFICIENT AND HIGH ELECTRIC CONDUCTIVITY

BACKGROUND OF THE INVENTION

1. Field of the Invention

The present invention relates to a complex oxide having a high Seebeck coefficient and a high electric conductivity, and to a thermoelectric material prepared from said complex oxide.

2. Description of the Related Art

In our country, effective energy is obtained at a ratio of only about 30% from the primary supply energy, and about 70% of the energy is eventually discarded as heat into the atmosphere. The heat evolved by combustion in plants, garbage-incinerating facilities or the like is thrown away into the atmosphere without conversion into other energy. In this way, we are uselessly casting away a vast amount of thermal energy and are acquiring only a small amount of energy from the combustion of fossil fuel or otherwise.

To increase the proportion of acquired energy, the thermal energy to be released into the atmosphere should be effectively utilized. For this purpose, thermoelectric conversion for direct conversion of thermal energy to electrical energy is an effective means. The thermoelectric conversion, which utilizes the Seebeck effect, is an energy conversion method for generating electricity by creating a difference in temperature between both ends of a thermoelectric material to produce a difference of electric potential. In this thermoelectric generation, electricity is generated simply by setting one end of a thermoelectric material at a location heated to a high temperature by waste heat, and the other end thereof in the atmosphere (room temperature) and connecting a leading wire to both ends thereof. This method entirely eliminates a need for a device with moving parts such as a motor or a turbine required in the common generation of power. As a consequence, the method is economical and can be carried out without giving off a gas by combustion. Moreover, the method can continuously generate electricity until the thermoelectric material is deteriorated.

As set forth above, thermoelectric generation is a technique expected to play a share in the role for the resolution of energy problems which will be concerned henceforth. To realize the thermoelectric generation, there is a need for developing thermoelectric materials which have a high thermoelectric conversion efficiency and have excellent heat resistance and chemical durability.

Currently, intermetallic compounds are known as a substance of high thermoelectric conversion efficiency. Among them, $Bi_2Te_3$ has the highest thermoelectric conversion efficiency. However, the thermoelectric conversion efficiency of $Bi_2Te_3$ is only about 10% at highest. Further, $Bi_2Te_3$ can be used only at a temperature of 200° C. or lower. TeAgSb-containing metallic compound has a high thermoelectric conversion efficiency in a temperature range of about 600 to about 1,000 K which falls in the temperature range of waste heat. However, Te and Sb are rare elements having toxicity and can not be used in the air because they are readily oxidizable. With the above drawbacks, $Bi_2Te_3$ and TeAgSb-containing metallic compound are limited in their application as a thermoelectric material for use.

In the foregoing situation, it is expected to develop materials composed of low-toxicity elements which have superior heat resistance and chemical durability and a high thermoelectric conversion efficiency.

While metallic oxides may be proposed as materials excellent in heat resistance and chemical durability, the metallic oxides are lower in thermoelectric conversion efficiency by an order of magnitude than $Bi_2Te_3$. In fact, known oxides having an electric conductivity of $1 \times 10^3$ S/m or more show a Seebeck coefficient only as low as tens $\mu$V/K.

DETAILED DESCRIPTION OF THE INVENTION

A principal object of the present invention is to provide a material composed of low-toxicity elements, the material being excellent in heat resistance and chemical durability and having a high thermoelectric conversion efficiency.

The present inventor conducted extensive research in view of the above-mentioned current situation regarding thermoelectric materials and found that a complex oxide having a specific composition which includes a rare earth element, Ca, Co and O as constituent elements has a high Seebeck coefficient and a high electric conductivity and is useful as a thermoelectric material in a thermoelectric module. The present invention was completed based on this novel finding.

The present invention provides the following complex oxides and thermoelectric material.

1. A complex oxide comprising the features of:
   (i) being represented by the formula: $Ca_{3-x}RE_xCo_4O_y$, wherein RE is a rare earth element, $0 \leq x \leq 0.5$ and $8.5 \leq y \leq 10$,
   (ii) having a Seebeck coefficient of 100 $\mu$V/K or more at a temperature of 300° C. or higher, and
   (iii) having an electric conductivity of $10^3$ S/m or more at a temperature of 300° C. or higher.
2. The complex oxide as defined in item 1, wherein RE is at least one element selected from the group consisting of Sc, Y, La, Ce, Pr, Nd, Pm, Sm, Eu, Gd, Tb, Dy, Ho, Er, Tm, Yb and Lu.
3. The complex oxide as defined in item 1 which has an oxygen deficient perovskite structure.
4. A P-type thermoelectric material prepared from the complex oxide as defined in item 1.

The complex oxide of the present invention is represented by the formula: $Ca_{3-x}RE_xCo_4O_y$. In the formula, RE is a rare earth element and is at least one element selected from the group consisting of Sc, Y, La, Ce, Pr, Nd, Pm, Sm, Eu, Gd, Tb, Dy, Ho, Er, Tm, Yb and Lu. The value of x ranges from 0.1 to 0.5, preferably from 0.1 to 0.25. The value of y ranges from 8.5 to 10, preferably from 8.8 to 9.2.

Figure 1:
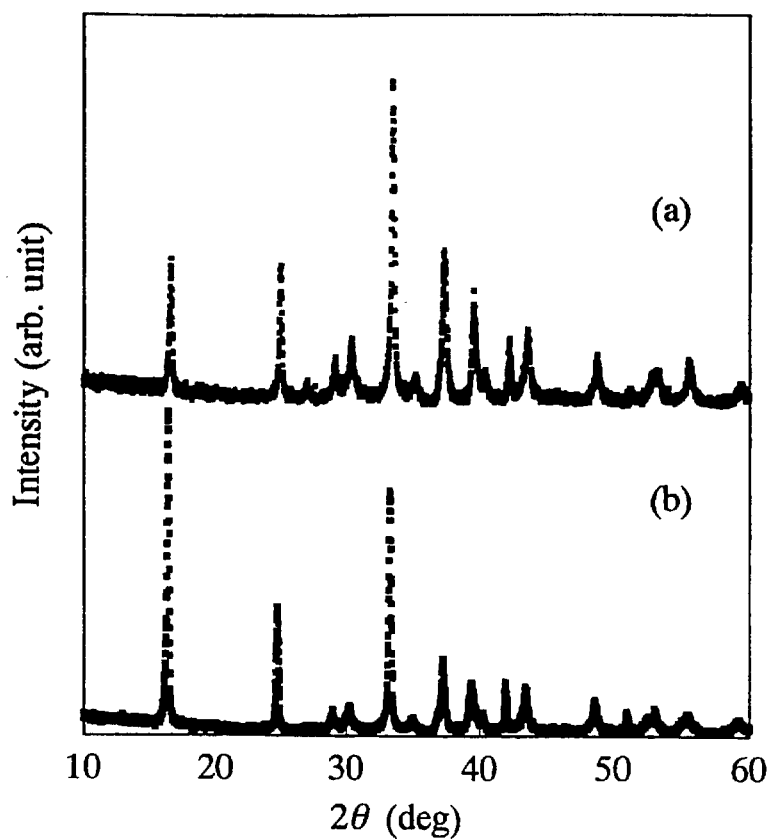
FIG. 1 shows a powder X-ray diffraction pattern of the complex oxide obtained in Example 1.

Such complex oxide has an oxygen deficient perovskite structure similar to $Ca_3Co_4O_9$ which is a conventional oxygen deficient perovskite. To clarify this matter, FIG. 1 shows a powder X-ray diffraction pattern of the complex oxide prepared in Example 1 to be described later. In FIG. 1, a pattern (a) shows an X-ray diffraction pattern of the complex oxide of the invention and a pattern (b) indicates an X-ray diffraction pattern of $Ca_3Co_4O_9$. From the patterns, it is evident that in the complex oxide of the present invention, the Ca site of $Ca_3Co_4O_9$ is replaced by a rare earth element in view of absence of a peak resulting from an impurity phase.

The complex oxide having the above-specified composition according to the invention has a Seebeck coefficient of 100 $\mu$V/K or more and an electric conductivity of $10^3$ S/m or more at a temperature of 300° C. or higher. The complex oxide of the invention can exhibit a high thermoelectric conversion efficiency when used as a thermoelectric material for a thermoelectric module, because the oxide has both a high Seebeck coefficient and a high electric conductivity. Further the complex oxide of the invention is excellent in heat resistance and chemical durability and is made of low-toxicity elements so that the oxide is very suitable for use as a thermoelectric material.

The complex oxide of the invention can be prepared by mixing the starting materials in the predetermined proportions and sintering them in an oxidizing atmosphere.

The starting materials are not limited insofar as they can produce the contemplated complex oxide when sintered. Examples are metals, oxides, compounds (such as carbonate), etc. Examples of compounds as the Ca source are calcium oxide (CaO), calcium chloride ($CaCl_2$), calcium carbonate ($CaCO_3$), calcium nitrate ($Ca(NO_3)_2$), calcium hydroxide ($Ca(OH)_2$), dimethoxy calcium ($Ca(OCH_3)_2$), diethoxy calcium ($Ca(OC_2H_5)_2$), dipropoxy calcium ($Ca(OC_3H_7)_2$), etc. Examples of compounds as the rare earth element (RE) source are oxides ($RE_2O_3$ such as $Gd_2O_3$), nitrates ($RE(NO_3)_3$), chlorides ($RECl_3$), hydroxides ($RE(OH)_3$), alkoxide compounds ($RE(OCH_3)_3$, $RE(OC_2H_5)_3$, $RE(OC_3H_7)_3$, etc.). Examples of compounds as the Co source are cobalt oxide (CoO, $Co_2O_3$, $Co_3O_4$, etc.), cobalt chloride ($CoCl_2$), cobalt carbonate ($CoCO_3$), cobalt nitrate ($Co(NO_3)_2$), cobalt hydroxide ($Co(OH)_2$), dipropoxy cobalt ($Co(OC_3H_7)_2$), etc. Also usable as the starting material are compounds containing at least two elements constituting the complex oxide of the invention.

Sintering means are not limited and can be selected from any desired means such as electric furnaces, gas furnaces and the like, and sintering may be conducted in an oxygen stream, the air or like oxidizing atmosphere.

The sintering temperature and sintering time are not limited and are so determined as to meet the conditions which allow the production of contemplated complex oxide. For example, the sintering is performed at about 920 to about 1100° C. for about 20 to about 40 hours. When carbonate, an organic compound or the like is used as the starting material, preferably the starting materials are calcined for decomposition prior to sintering and then sintered to give the contemplated complex oxide. For example, when carbonate is used as the starting material, it is calcined at about 800 to about 900° C. for about 10 hours and then sintered under the above-mentioned conditions.

The amount of oxygen in a complex oxide to be produced is controllable depending on the partial pressure of oxygen in sintering, sintering temperature, sintering time and the like. The higher the partial pressure of oxygen is, the higher the value of y in said formula is.

The complex oxide of the invention prepared in this way has both a high Seebeck coefficient and a high electric conductivity so that the oxide can be effectively used as the thermoelectric material for a thermoelectric module.

Figure 2:
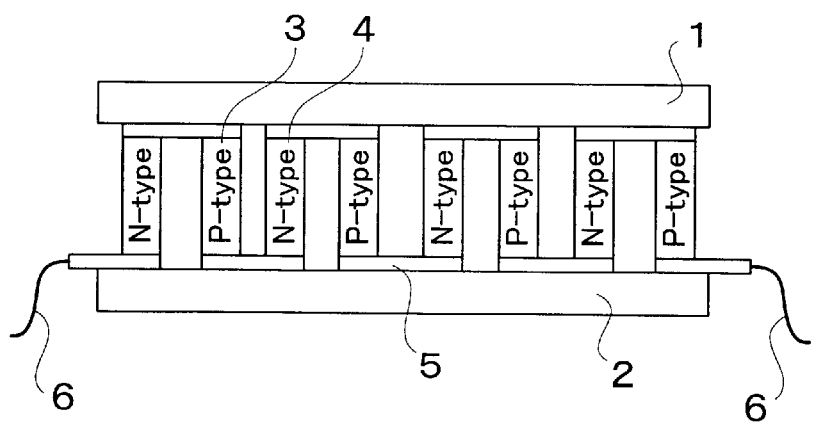
FIG. 2 schematically shows a thermoelectric module produced using the complex oxide of the invention as a thermoelectric material.

FIG. 2 schematically shows by way of example a thermoelectric module produced using the complex oxide of the invention as the thermoelectric material. The thermoelectric module has the same structure as conventional thermoelectric modules. The complex oxide of the invention is used as a P-type thermoelectric material in a thermoelectric module which comprises a base plate for a high-temperature location 1, a base plate for a low-temperature location 2, a P-type thermoelectric material 3, an N-type thermoelectric material 4, an electrode 5 and a leading wire 6.

The complex oxide of the invention has a high Seebeck coefficient and a high electric conductivity and is excellent in heat resistance and chemical durability.

The complex oxide of the invention finds applications as a thermoelectric material usable at a high temperature unlike conventional intermetallic compounds which are unsuitable for such applications. Consequently it is expected that the thermal energy heretofore cast away into the atmosphere can be effectively used by incorporating the complex oxide of the invention into a thermoelectric generation system.

EXAMPLES

Examples are given below to further clarify the features of the present invention.

Example 1

Using calcium carbonate ($CaCO_3$) as the Ca source, gadolinium oxide ($Gd_2O_3$) as the Gd source, and cobalt oxide ($CO_3O_4$) as the Co source, thorough mixing was conducted at a mixing ratio (mole ratio) of 2.5:9.5:4 of Ca:Gd:Co. The mixture was charged into a crucible made of alumina and was calcined in an electric furnace at a temperature of 800° C. for 10 hours. The calcined product was crushed, press-molded and sintered in an oxygen stream at 920° C. for 40 hours to produce a complex oxide. The obtained complex oxide is one represented by the formula $Ca_{2.5}Gd_{0.5}Co_4O_9$.

Figure 3:
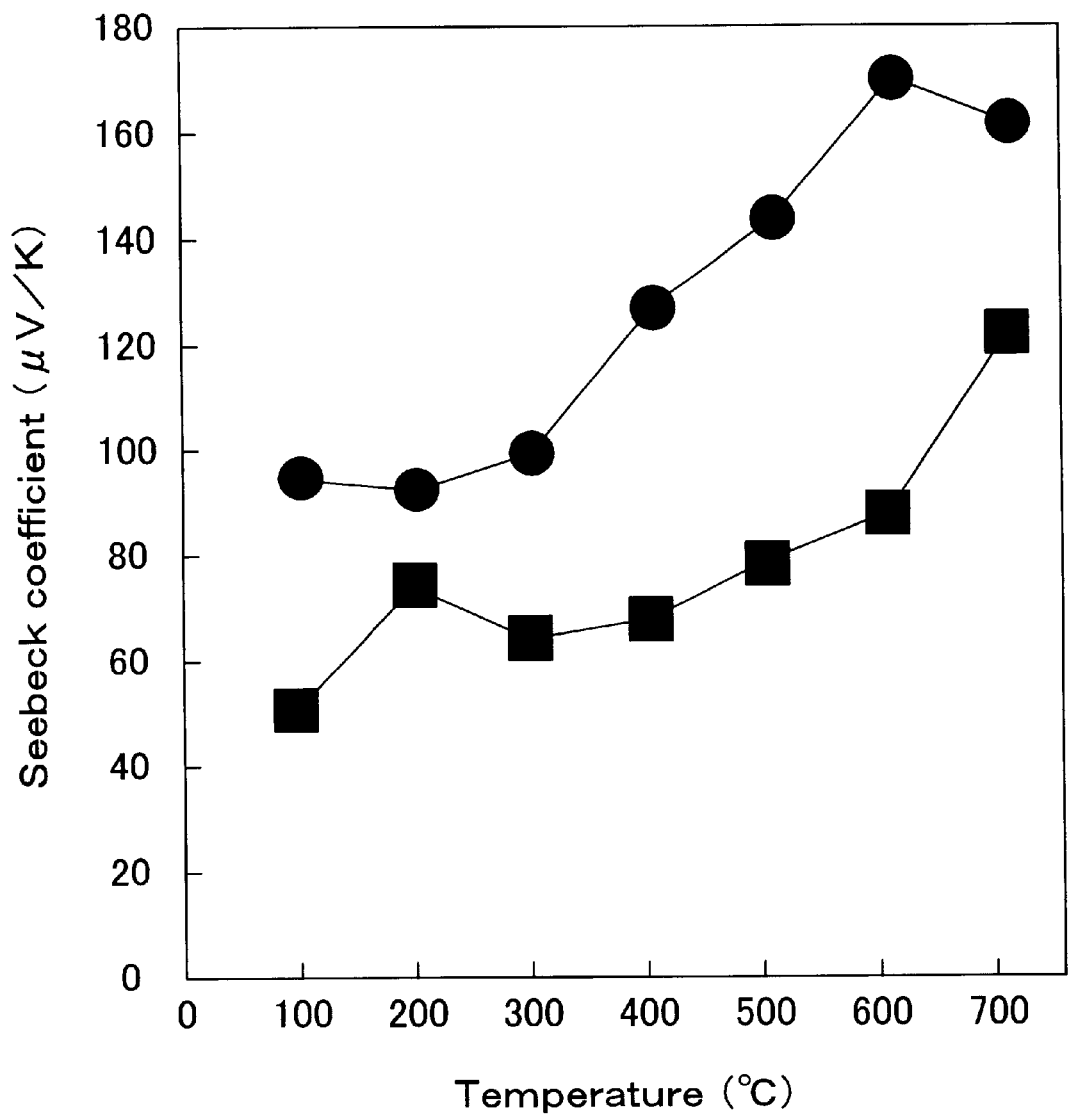
FIG. 3 is a graph showing the temperature dependency of Seebeck coefficient of the complex oxide prepared in Example 1.

FIG. 3 is a graph showing the temperature dependency of Seebeck coefficient (S) of the obtained complex oxide at 100 to 700° C. In FIG. 3, the mark ● represents the measured results of the complex oxide of the invention and the mark ■ represents the measured results of $Ca_3Co_4O_9$. From FIG. 3, it is clear that the obtained complex oxide exhibits a Seebeck coefficient of 100 $\mu$V/K or more in the temperature range of 300 to 700° C.

Figure 4:
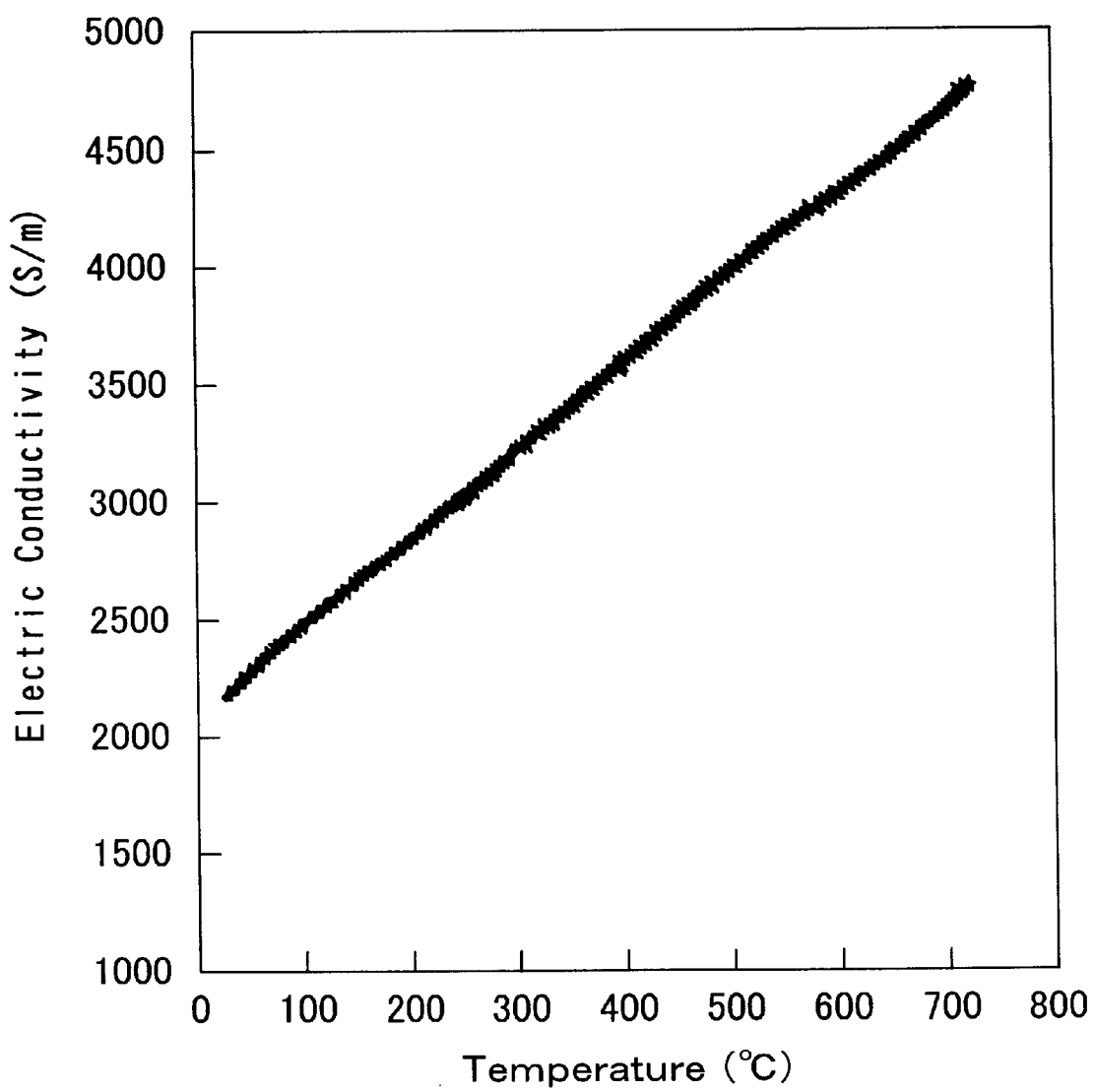
FIG. 4 is a graph showing the temperature dependency of electric conductivity of the complex oxide prepared in Example 1. In the drawings, indicated at 1 is a base plate for a high-temperature location; at 2, a base plate for a low-temperature location; at 3, a P-type thermoelectric material; at 4, an N-type thermoelectric material; at 5, an electrode; and at 6, a leading wire.

FIG. 4 is a graph showing the temperature dependency of electric conductivity ($\sigma$) of the complex oxide as determined by a direct current 4-terminal method. It is apparent from FIG. 4 that the electric conductivity of the complex oxide increases with the elevation of temperature, i.e., shows a semiconductor-like behavior and reaches a high value of more than $3\times10^3$ S/m at 300° C.

Examples 2–16

Complex oxides represented by the formula $Ca_{2.5}RE_{0.5}Co_4O_{8.8-9.2}$ were produced in the same manner as in Example 1 with the exception of replacing the rare metal element compound used as the starting material with the compounds shown in Table 1.

The Seebeck coefficient (S) and electric conductivity ($\sigma$) of the obtained complex oxides were measured with the results shown in Table 1.

TABLE 1

| Ex. No. | RE Kind | Starting Compound | Seebeck Coefficient ($\mu$V/K) | Electric Conductivity ($10^3$ S/m) | Measuring Temperature (°C) |
|---|---|---|---|---|---|
| 1 | Gd | $Gd_2O_3$ | 170 | 4.3 | 600 |
| 2 | Sc | $Sc_2O_3$ | 152 | 4.8 | 700 |
| 3 | Y | $Y_2O_3$ | 163 | 4.5 | 500 |
| 4 | La | $La_2O_3$ | 145 | 4.2 | 500 |
| 5 | Ce | $CeO_2$ | 140 | 3.8 | 500 |
| 6 | Pr | $Pr_2O_3$ | 155 | 4.5 | 500 |
| 7 | Nd | $Nd_2O_3$ | 160 | 4.6 | 500 |
| 8 | Sm | $Sm_2O_3$ | 154 | 4.0 | 500 |
| 9 | Eu | $Eu_2O_3$ | 120 | 5.2 | 600 |
| 10 | Tb | $Tb_4O_7$ | 135 | 3.6 | 600 |
| 11 | Dy | $Dy_2O_3$ | 147 | 3.9 | 600 |
| 12 | Ho | $Ho_2O_3$ | 150 | 4.1 | 700 |
| 13 | Er | $Er_2O_3$ | 158 | 4.2 | 700 |
| 14 | Tm | $Tm_2O_3$ | 142 | 4.5 | 700 |
| 15 | Yb | $Yb_2O_3$ | 139 | 4.8 | 700 |
| 16 | Lu | $Lu_2O_3$ | 120 | 5.3 | 700 |

Examples 17–32

Complex oxides represented by the formula $Ca_{2.75}RE_{0.25}Co_4O_{8.8-9.2}$ were produced in the same manner as in Example 1 with the exception of replacing the rare metal element compound used as the starting material with the compounds shown in Table 2, using the starting materials in a mixing mole ratio of 2.75:0.25:4 of Ca:RE:Co and sintering them at 1000° C. for 30 hours.

The Seebeck coefficient (S) and electric conductivity ($\sigma$) of the obtained complex oxides were measured with the results shown in Table 2.

TABLE 2

| Ex. No. | RE Kind | Starting Compound | Seebeck Coefficient ($\mu$V/K) | Electric Conductivity ($10^3$ S/m) | Measuring Temperature (°C) |
|---|---|---|---|---|---|
| 17 | Gd | $Gd_3O_3$ | 157 | 5.2 | 600 |
| 18 | Sc | $Sc_2O_3$ | 146 | 5.6 | 700 |
| 19 | Y | $Y_2O_3$ | 160 | 5.3 | 500 |
| 20 | La | $La_2O_3$ | 140 | 5.8 | 500 |
| 21 | Ce | $CeO_2$ | 138 | 5.8 | 500 |
| 22 | Pr | $Pr_2O_3$ | 142 | 5.5 | 500 |
| 23 | Nd | $Nd_2O_3$ | 156 | 5.4 | 500 |
| 24 | Sm | $Sm_2O_3$ | 150 | 5.5 | 500 |
| 25 | Eu | $Eu_2O_3$ | 115 | 6.0 | 600 |
| 26 | Tb | $Tb_4O_7$ | 127 | 5.8 | 600 |
| 27 | Dy | $Dy_2O_3$ | 136 | 5.7 | 600 |
| 28 | Ho | $Ho_2O_3$ | 145 | 5.5 | 700 |
| 29 | Er | $Er_2O_3$ | 145 | 5.4 | 700 |
| 30 | Tm | $Tm_2O_3$ | 130 | 5.9 | 700 |
| 31 | Yb | $Yb_2O_3$ | 132 | 5.9 | 700 |
| 32 | Lu | $Lu_2O_3$ | 115 | 6.3 | 700 |

Examples 33–48

Complex oxides represented by the formula $Ca_{2.9}RE_{0.1}Co_4O_{8.8-9.2}$ were produced in the same manner as in Example 1 with the exception of replacing the rare metal element compound used as the starting material with the compounds shown in Table 3, using the starting materials in a mixing mole ratio of 2.9:0.1:4 of Ca:RE:Co and sintering them at 1100° C. for 20 hours.

The Seebeck coefficient (S) and electric conductivity ($\sigma$) of the obtained complex oxides were measured with the results shown in Table 3.

TABLE 3

| Ex. No. | RE Kind | Starting Compound | Seebeck Coefficient ($\mu$V/K) | Electric Conductivity ($10^3$ S/m) | Measuring Temperature (°C) |
|---|---|---|---|---|---|
| 33 | Gd | $Gd_3O_3$ | 150 | 6.5 | 600 |
| 34 | Sc | $Sc_2O_3$ | 140 | 6.8 | 700 |
| 35 | Y | $Y_2O_3$ | 155 | 6.6 | 500 |
| 36 | La | $La_2O_3$ | 128 | 7.2 | 500 |
| 37 | Ce | $CeO_2$ | 128 | 7.3 | 500 |
| 38 | Pr | $Pr_2O_3$ | 130 | 7.0 | 500 |
| 39 | Nd | $Nd_2O_3$ | 147 | 6.7 | 500 |
| 40 | Sm | $Sm_2O_3$ | 137 | 7.0 | 500 |
| 41 | Eu | $Eu_2O_3$ | 105 | 7.8 | 600 |
| 42 | Tb | $Tb_4O_7$ | 114 | 7.7 | 600 |
| 43 | Dy | $Dy_2O_3$ | 127 | 7.1 | 600 |
| 44 | Ho | $Ho_2O_3$ | 136 | 6.9 | 700 |
| 45 | Er | $Er_2O_3$ | 137 | 6.7 | 700 |
| 46 | Tm | $Tm_2O_3$ | 123 | 7.0 | 700 |
| 47 | Yb | $Yb_2O_3$ | 120 | 7.1 | 700 |
| 48 | Lu | $Lu_2O_3$ | 102 | 8.0 | 700 |

The results obtained above show that the complex oxides of the present invention have a high Seebeck coefficient and a high electric conductivity.

What is claimed is:

1. A complex oxide having the formula: $Ca_{3-x}RE_xCo_4O_y$, wherein RE is a rare earth element, $0 \leq x \leq 0.5$ and $8.5 \leq y \leq 10$.

2. The complex oxide according to claim 1, wherein RE is at least one element selected from the group consisting of Sc, Y, La, Ce, Pr, Nd, Pm, Sm, Eu, Gd, Tb, Dy, Ho, Er, Tm, Yb and Lu.

3. The complex oxide according to claim 1, wherein the complex oxide has an oxygen deficient perovskite structure.

4. The complex oxide according to claim 1, wherein the complex oxide has a Seebeck coefficient of at least 100 $\mu$V/K at a temperature of 300° C. or higher.

5. The complex oxide according to claim 4, wherein the complex oxide has an electric conductivity of at least $10^3$ S/m at a temperature of 300° C. or higher.

6. The complex oxide according to claim 1, wherein the complex oxide has an electric conductivity of at least $10^3$ S/m at a temperature of 300° C. or higher.

7. A P-type thermoelectric material prepared from the complex oxide according to claim 1.

8. A method of preparing $Ca_{3-x}RE_xCo_4O_y$, wherein RE is a rare earth element, $0 \leq x \leq 0.5$, and $8.5 \leq y \leq 10$ comprising:
    mixing a source of calcium, a source of rare earth, and a source of cobalt; and
    sintering the source of calcium, the source of rare earth, and the source of cobalt in an oxidizing atmosphere at a temperature of about 920 to about 1100° C. for about 20 to about 40 hours.

9. The method according to claim 8, further comprising controlling a partial pressure of oxygen in said oxidizing atmosphere, thereby controlling the value of y.

10. A thermoelectric module for converting thermal energy to electrical energy comprising:
    a P-type thermoelectric material prepared from the complex oxide according to claim 1;
    a N-type thermoelectric material;
    at least one electrode joining said P type thermoelectric material to said N-type thermoelectric material; and
    a wire connected to said P-type thermoelectric material; and
    a wire connected to said N-type thermoelectric material.

* * * * *

UNITED STATES PATENT AND TRADEMARK OFFICE
CERTIFICATE OF CORRECTION

PATENT NO.     : 6,376,763 B2
DATED          : April 23, 2002
INVENTOR(S)    : Ryoji Funahashi, Ichiro Matsubara and Satoshi Sodeoka It is certified that error appears in the above-identified patent and that said Letters Patent is hereby corrected as shown below:

<u>Title page,</u>
Item [73], insert -- Secretary, -- before "Agency".

Signed and Sealed this

First Day of April, 2003

JAMES E. ROGAN
*Director of the United States Patent and Trademark Office*